(12) United States Patent
Zehavi et al.

(10) Patent No.: US 7,137,546 B2
(45) Date of Patent: *Nov. 21, 2006

(54) SILICON TUBE FORMED OF BONDED STAVES

(75) Inventors: Raanan Zehavi, Sunnyvale, CA (US); James E. Boyle, Saratoga, CA (US); Robert W. Mytton, Salem, OR (US)

(73) Assignee: Integrated Materials, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/642,013

(22) Filed: Aug. 15, 2003

(65) Prior Publication Data

US 2004/0129203 A1 Jul. 8, 2004

Related U.S. Application Data (60) Division of application No. 09/965,106, filed on Sep. 26, 2001, now abandoned, which is a continuation-in-part of application No. 09/860,392, filed on May 18, 2001.

(51) Int. Cl.
*C03B 23/20* (2006.01)

(52) U.S. Cl. ........................ 228/121; 206/711; 156/329; 65/42; 65/43

(58) Field of Classification Search .............. 228/121; 206/711–454; 118/728, 500
See application file for complete search history.

(56) References Cited

U.S. PATENT DOCUMENTS

| | | | | |
|---|---|---|---|---|
| 2,336,995 A | * | 12/1943 | MacKenzie et al. | ........ 138/161 |
| 4,066,120 A | * | 1/1978 | Mold et al. | .................. 165/165 |
| 4,428,975 A | * | 1/1984 | Dahm et al. | ................. 438/791 |
| 4,587,700 A | * | 5/1986 | Curbishley et al. | ........ 29/889.2 |
| 4,666,775 A | * | 5/1987 | Kim et al. | .................. 428/398 |
| 5,102,494 A | * | 4/1992 | Harvey et al. | ................. 117/25 |
| 5,364,010 A | * | 11/1994 | Mizuhara | .................. 228/124.6 |
| 5,468,297 A | * | 11/1995 | Letort | ........................ 118/728 |

(Continued)

FOREIGN PATENT DOCUMENTS

JP        2-229692        * 9/1990

OTHER PUBLICATIONS

Boyle et al., "An evaluation of Semi-conductor grade polysilicon fixtures in thin-film (LPCVD-nitride and poly), high temperature and RTP in furnace applications,", Sep. 2000, 12 pages.*

*Primary Examiner*—Jonathan Johnson
(74) *Attorney, Agent, or Firm*—Charles S. Guenzer (57) ABSTRACT

Tubular silicon members advantageously formed by extrusion from a silicon melt or by fixing together silicon staves in a barrel shape. A silicon-based wafer support tower is particularly useful for batch-mode thermal chemical vapor deposition and other high-temperature processes, especially reflow of silicate glass at above 1200° C. The surfaces of the silicon tower are bead blasted to introduce sub-surface damage, which produces pits and cracks in the surface, which anchor subsequently deposited layer of, for example, silicon nitride, thereby inhibiting peeling of the nitride film. Wafer support portions of the tower are preferably composed of virgin polysilicon. The invention can be applied to other silicon parts in a deposition or other substrate processing reactor, such as tubular sleeves and reactor walls. The tower parts are preferably pre-coated with silicon nitride or polysilicon prior to chemical vapor deposition of these materials, or with silicon nitride prior to reflow of silica.

26 Claims, 6 Drawing Sheets

U.S. PATENT DOCUMENTS

| | | | |
|---|---|---|---|
| 5,529,651 A * | 6/1996 | Yoshida et al. | 156/85 |
| 5,538,230 A * | 7/1996 | Sibley | 269/296 |
| D404,371 S * | 1/1999 | Shimazu | D13/182 |
| D411,176 S * | 6/1999 | Shimazu | D13/182 |
| 6,056,123 A * | 5/2000 | Niemirowski et al. | 206/711 |
| 6,203,752 B1 * | 3/2001 | Bewlay et al. | 419/6 |
| 6,247,221 B1 * | 6/2001 | Ritland et al. | 29/458 |
| 6,450,346 B1 * | 9/2002 | Boyle et al. | 211/41.18 |
| 6,528,391 B1 * | 3/2003 | Henley et al. | 438/459 |
| 6,532,642 B1 * | 3/2003 | Wingo | 29/558 |
| 2001/0044999 A1 * | 11/2001 | Ritland et al. | 29/458 |

* cited by examiner

ADDED PARTICLES (PRIOR ART)
FIG. 1

SILICON TUBE FORMED OF BONDED STAVES

RELATED APPLICATION

This application is a division of Ser. No. 09/965,106, filed Sep. 26, 2001, now abandoned which is a continuation in part of Ser. No. 09/860,392, filed May 18, 2001.

BACKGROUND OF THE INVENTION

1. Field of the Invention

The invention relates generally to silicon structures. In particular the invention relates to silicon tubes useful in reactors used in batch-mode semiconductor processing such as chemical vapor deposition and high temperature annealing.

2. Background Art

The fabrication of silicon integrated circuits typically involves one or more steps of chemical vapor deposition (CVD). Many advanced deposition processes use plasma enhanced CVD to activate the chemical reaction resulting in the deposition of the film from a precursor gas. The plasma process allows low temperature deposition. On the other hand, thermal CVD is performed at elevated temperatures to thermally activate the chemical reaction resulting in the deposition of the film from a precursor gas. The temperatures associated with thermal CVD tend to be much higher than those for plasma enhanced CVD, but thermal CVD temperatures fall within a wide range depending upon the material being deposited and the precursor gas.

Thermal CVD is typically utilized for the deposition of silicon nitride and polysilicon. The silicon nitride is used, for example, for etch stop layers and anti-reflective coatings. Silicon nitride has a nominal composition of $Si_3N_4$, but some compositional variation is expected, such as $SiN_x$, where x ranges between 1.0 and 1.5. Polysilicon is polycrystalline silicon. It is used for anti-reflective coating and, when doped, for interconnects and electrodes.

Despite the trend to single-wafer processing chambers, batch processing for thermal CVD continues to be widely practiced because of its high throughput and the relatively low cost of equipment. Furthermore, thermal CVD can produce highly uniform films in batch processing. In batch CVD processing, a large number of silicon wafers are loaded onto a support fixture that is placed into a thermal CVD reactor. Typically, the support fixture is a tower in which the multiple wafers are supported horizontally and spaced vertically apart. Some applications continue to use boats as support fixture in which the multiple wafers are supported substantially vertically and spaced horizontally apart.

In the case of the deposition of silicon nitride, the precursor gas is typically composed of a silane or a chlorosilane and a nitrogen source such ammonia. At elevated temperatures, typically in the range of 600 to 800° C. but sometimes extending down to 400° C. or even lower, the precursors react near the surface of the wafer to deposit silicon nitride on the wafer surface. In the case of chlorosilane and ammonia precursors, the reaction products are $Si_3N_4$ and $NH_4Cl$. The former deposits on the wafer while the latter is volatile and is evacuated from the furnace. However, thermal CVD tends to coat all surfaces exposed in the furnace. In particular, the support tower is typically coated with as much silicon nitride as is the wafer. Further, the walls of the reactor, typically formed in a tubular shape, also tend to be coated.

Quartz has in the past been the most prevalently used material for support towers and tubes used in a thermal CVD process and other high-temperature processes. Quartz has a chemical composition of amorphous silicon dioxide, which is compatible with most silicon processing. At the relatively low temperatures usually experienced in CVD, whether thermal or plasma enhanced, quartz remains in a glassy state with a very smooth surface so that it is a very clean material. However, as the feature sizes on integrated circuits has decreased to 0.18 µm and even smaller, quartz support towers have nonetheless experienced substantial problems because of their tendency to produce particles. These particulates fall on the wafer and can significantly reduce the yield of operable integrated circuit dies obtained from the wafer.

Figure 1:
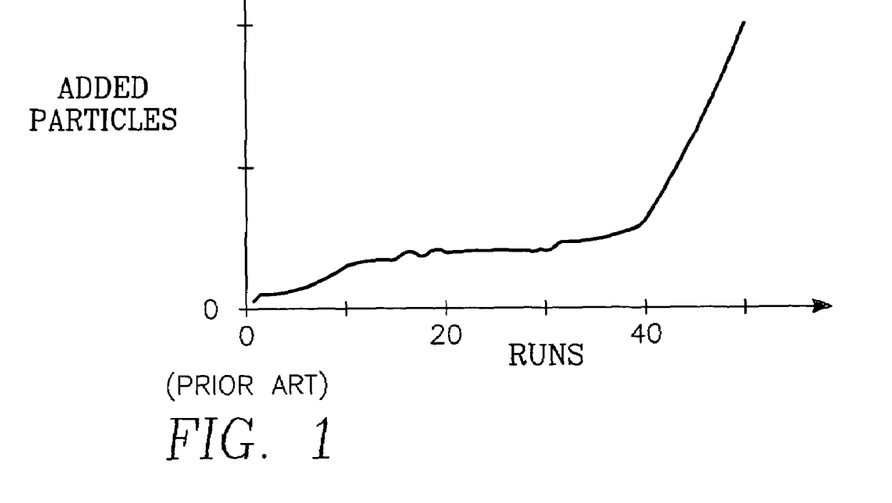
FIG. 1 is a schematic chart showing the generation of particles during batch thermal chemical vapor deposition using a quartz tower of the prior art.

Often integrated circuit fabrication is monitored by measuring the number of particles added to a wafer by any step of the fabrication process. It has been found in thermal CVD of silicon nitride that the number of particles generally increases with the number of runs or batches that the quartz tower has processed. As illustrated in FIG. 1, a new tower produces relatively few particles. Thereafter, the number of particles increases with the number of runs, but up to about forty runs the number is acceptable, though still somewhat high. However, after some number of runs, the number of particles greatly increases to a totally unacceptable level. It is believed that the origin of the problem is that the silicon nitride is also depositing on the quartz tower. For 40 runs of depositing 0.15 µm of silicon nitride, a typical nitride layer thickness in an integrated circuit, the nitride may build up on the tower to a thickness of 6 µm. Silicon nitride has a coefficient of thermal expansion that is significantly different than that of quartz, about $3 \times 10^{-6}$ versus $0.5 \times 10^{-6}$/° C., and the nitride does not bond well with the glassy quartz surface. Differential thermal expansion between the two materials as the tower is cycled between room temperature and the relatively modest thermal CVD temperatures causes the thickly deposited nitride to peel from the quartz and to produce nitride particles, some of which settle on the wafers.

For these reasons, it is typical practice in a production environment to use a tower only for a predetermined number of runs somewhat below the experimentally determined point at which the particle count rapidly increases, for example, thirty runs for the data displayed in FIG. 1. It is common practice to then clean the quartz tower in bath of hydrofluoric acid and nitric acid to remove the silicon nitride and to return the cleaned tower to service for another cycle of runs. However, the baseline particle count for a cleaned tower is somewhat higher than that for a new tower, and the number of runs before onset of unacceptable particle count is reduced by about 25%. As a result, quartz towers are typically discarded after only two or three cycles. Although quartz towers are relatively inexpensive, such short life greatly increases the cost of ownership (COO) when measured per wafer. Also, the necessity of changing out towers and cleaning towers complicates the work flow and reduces productivity.

Furthermore, the baseline particle counts for quartz towers are still high, and the onset of greatly increased counts is somewhat variable. Both factors reduce the yield of operable dice obtained from the wafers.

Quartz tubes are also often replaced after a finite number of batches although the problem being addressed is often fracturing of the quartz tube.

Some of these reasons have prompted the use of silicon carbide towers. Bulk silicon carbide is typically formed by a sintering process, which produces a material containing a high fraction of impurities. For this reason, the sintered material is usually covered with a layer of CVD silicon carbide. As long as the CVD layer is not punctured, contamination is not a problem. The peeling problem is not totally eliminated. However, after a nitride buildup of about 20 μm on the silicon carbide tower, it can cleaned in a mixed acid etch for up to a week with the result that the tower can be used almost indefinitely. However, the CVD silicon carbide film is fragile, and a single pin hole through the film ruins the protective coating resulting in the necessity that the tower be scrapped. Entire towers of CVD silicon carbide can be made, but they are very expensive.

Accordingly, it is greatly desired to provide a support tower that is not subject to such particle problems and can be used for many more runs without cleaning or replacement.

Suggestions have been made to form wafer support towers from silicon, particularly polysilicon. See, for example, U.S. Pat. No. 6,056,123 to Niemirowski et al. They fabricate their towers from silicon legs mechanically wedged into silicon end plates, and a layer of polysilicon is then deposited by chemical vapor deposition on the assembled structure to provide additional strength. Their tower fabrication is believed to still be weak. Further, when silicon towers are used to support wafer preformed with a silica glass that requires reflowing at high temperature, the wafers have been observed to stick to the tower after reflow. Forcefully removing the stuck wafer may result in the tower becoming chipped. Some believe that the silica glass reflows over the edge of the wafer and intimately bonds with the exposed silicon and a silica bridge is formed between the wafer and the tower.

SUMMARY OF THE INVENTION

The invention includes a method of chemical vapor deposition (CVD), particularly thermal CVD, and more particularly deposition of silicon nitride, polysilicon, and related materials, onto multiple wafers supported on a silicon fixture, for example, a tower. Preferably, the silicon fixture is composed of virgin polysilicon. Also, preferably, surfaces of the silicon tower are subjected to surface treatment, such as bead blasting by hard particles, for example, of silicon carbide. The surface treatment may be characterized as introducing sub-surface damage in the silicon part.

The invention also includes such a silicon fixture and its fabrication method. The surface of the fixture has a roughness preferably in the range of 10–100 microinches Ra (0.25–2.5 μcm), more preferably 20–75 microinches Ra (0.5–1.9 μm), and most preferably 35–50 microinches Ra (0.9–1.25 μm).

The invention further includes other surface treated silicon parts usable in a CVD reactor or other high-temperature substrate processing reactor.

According to another aspect of the invention, a silicon tower is pre-coated with a thin layer, for example, by chemical vapor deposition. When the tower is supporting wafers in high-temperature deposition of silicon nitride or polysilicon, the tower is preferably initially pre-coated with a thin layer of silicon nitride or polysilicon respectively. Cracks and pits produced the surface treatment firmly anchors the initial film and subsequently deposited films. When the tower is supporting wafers in high-temperature deposition or oxidation producing silica, the tower is preferably initially coated with a thin layer of silicon nitride.

The invention is further applicable to a high-temperature reflow step following deposition of silica layer, for example, by CVD or flame hydrolysis. The reflow step is typically performs at above 1200° C., preferably at 1350±30° C. for a commonly used silica formulation, and most preferably at 1360±10° C.

In a further aspect of the invention, silicon tubular members may advantageously be used for liners in CVD reactors and for tubular reactor walls used in high-temperature processing. Such silicon tubular members may conveniently be formed by extrusion, whether or not the tube is surface treated, or by bonding together in a polygonal shape a large number of trapezoidally shaped staves and preferably thereafter machining the interior to form a cylindrical bore. Such silicon tubes are often advantageously surface treated and pre-coated.

BRIEF DESCRIPTION OF THE PREFERRED EMBODIMENTS

Silicon fixtures, particularly horizontally extending boats, have been frequently suggested and occasionally used in the past. However, their assembly has presented sufficient problems to prevent the widespread use of silicon towers. Many of these problems with silicon support fixtures have been addressed in a set of patents, U.S. Pat. Nos. 6,196,211, 6,205,993, and 6,225,594 to various of Zehavi, Davis, and Delaney. Boyle et al. in U.S. patent application, Ser. No. 09/608,557, filed Jun. 30, 2000, now issued as U.S. Pat. No. 6,450,346, and incorporated herein by reference in its entirety, disclose in detail a method of fabricating one embodiment of such a silicon tower 10, illustrated in FIG. 2. The tower 10 includes multiple silicon legs 12 joined at opposed ends to silicon bases 14. Teeth 16 are cut into the legs 12 to support the wafers.

Figure 2:
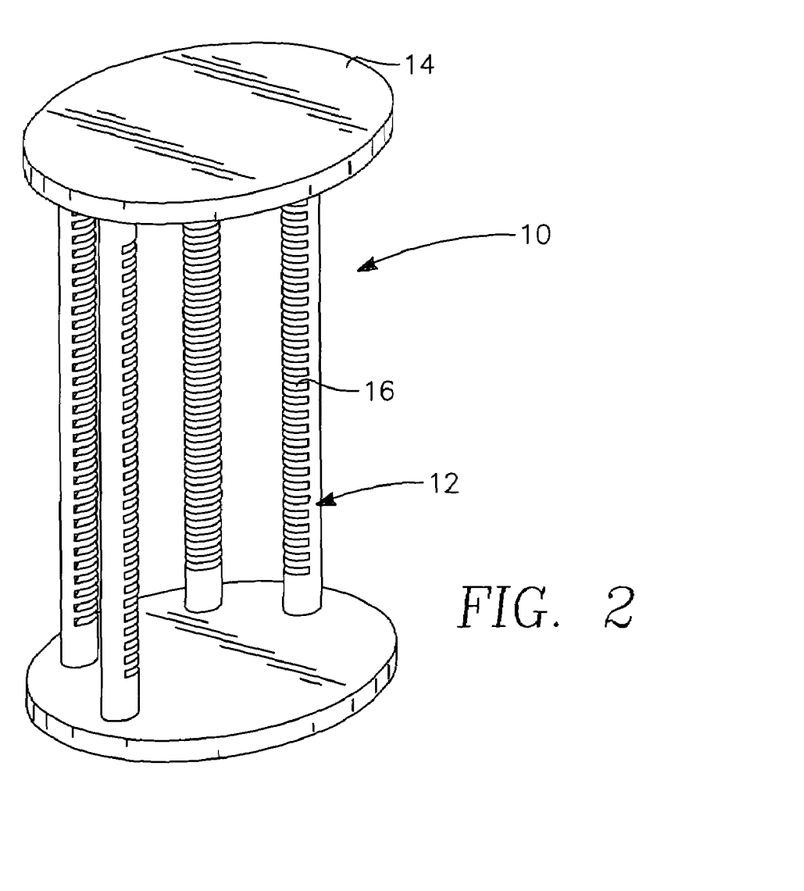
FIG. 2 is an orthographic view of a silicon tower fabricated according to the invention and usable in the processes of the invention.

It is preferred that at least the legs 12 are composed of virgin polysilicon (virgin poly) formed from the chemical vapor deposition of silane or chlorosilane. Such a material is virtually free of contaminants, particularly the rapidly diffusing metals so deleterious to silicon integrated circuits. The bases may be formed of Czochralski (CZ) silicon, preferably polysilicon although monocrystalline may be used, since virgin poly is not typically available in such large diameters. Other forms of silicon such as cast silicon may be used. The process includes joining the legs 12 to the bases 14 with a spin-on glass (SOG) or other glass-like compound followed by high-temperature ambient annealing at preferably between 1025 and 1400° C. to vitrify the SOG and bond it to the already oxidized silicon parts. Alternatively, the pieces may be laser welded together in a process described by Zehavi et al. in U.S. Pat. No. 6,284,997, scheduled to issue on Sep. 4, 2001 and incorporated herein by reference in its entirety. The advantage of either method is forming a continuous planar bond extending along the plane of the interface between the two fixed pieces, unlike the mechanical wedges and surface layer of Niemirowski et al.

Figure 3:
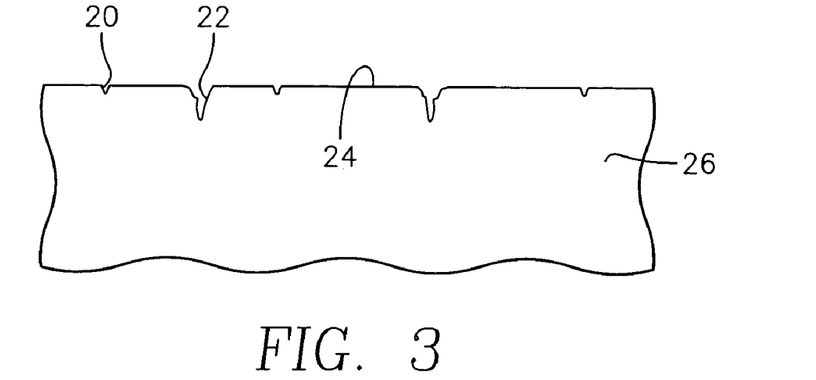
FIG. 3 is a cross-sectional view of a surface of the silicon tower after bead blasting.

After assembly, the tower 10, including both the legs 12 and bases 14, is subjected to a surface treatment to introduce controlled sub-surface damage in the silicon. Such a surface treatment virtually eliminates the particle problem usually associated with thermal CVD of silicon nitride. We believe that the surface treatment not only removes the thick oxide layer formed in the SOG anneal, but also, as illustrated in the cross-sectional view of FIG. 2 produces pits 20 and cracks 22 penetrating into the treated surface 24 of the silicon part 26 of the tower 10. The silicon part 26 may be one of the legs 12 or one of the bases 14.

Figure 4:
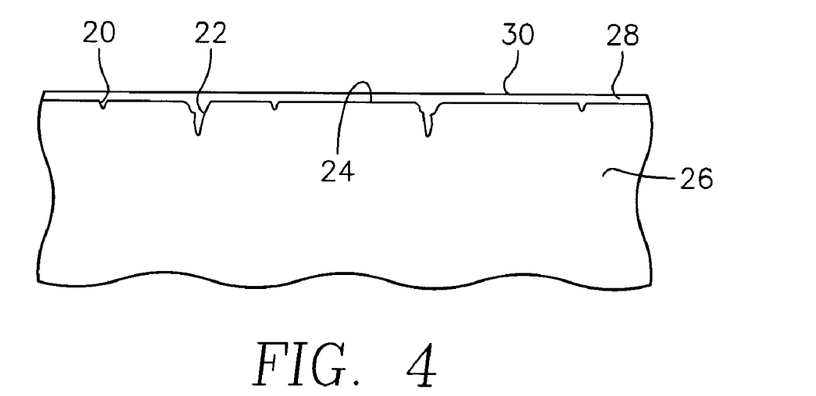
FIG. 4 is a cross-sectional view of the silicon tower surface of FIG. 3 after deposition of a pre-coat layer.
Figure 5:
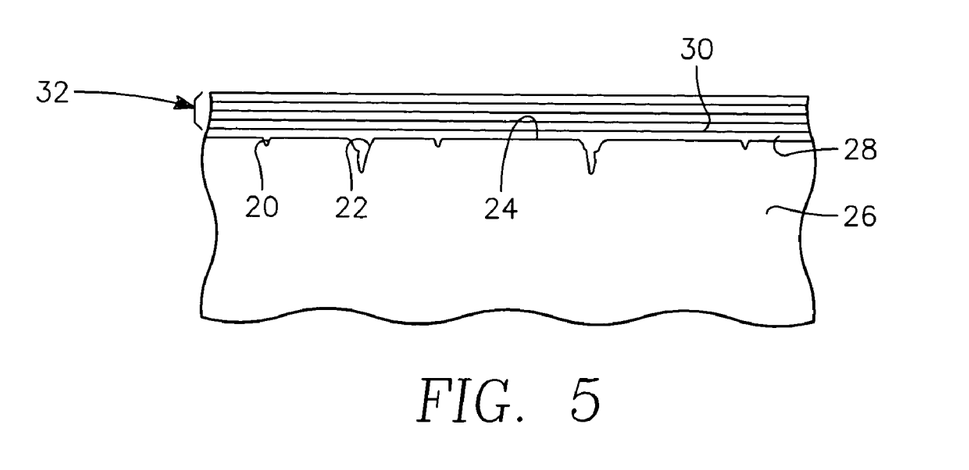
FIG. 5 is a cross-sectional view of the silicon tower surface of FIG. 4 after many runs of depositing silicon nitride.

When the tower enters service, it is preferably first subjected to a pre-treatment similar to a typical nitride CVD deposition in which a silicon nitride pre-coat layer 28 not only covers the part surface 24 but also fills the pits 20 and cracks 22 to produce a smooth pre-coat surface 30. Typical thicknesses of the pre-coat layer 28 range between 0.1 and 10 μm. Preferably, during the pre-treatment, no wafers are inserted in the tower slots to be used in production. The silicon nitride in the pits 20 and cracks 22 firmly anchors the pre-coat layer 28 to the silicon part. Thereafter, when the tower enters normal production, subsequently deposited silicon nitride layers 32 are sequentially deposited over the silicon nitride pre-coat layer 28, which is firmly anchored to the silicon part 26. Although differential thermal expansion continues to exist between the nitride layers 32 and the underlying bulk silicon 26, the force exerted at the interface is insufficient to peel the nitride layers 32 from the part 26.

An effective method of work treating the silicon surface is to roughen it by bead blasting, which is similar to industrial sand blasting. A preferred such method is to blast the surface with particles of silicon carbide of 220 grey grit in a Model 48/PP dry blaster available from Trinity Tool Co. of Fraser, Mich. Particle velocity is controlled by an exit pressure of between about 20 and 80 psi. In the bead blasting, the blasting wand is manually swept over all exposed surfaces of the assembled tower. The blasting need not visibly roughen the silicon surface. The silicon surface following the preceding high-temperature SOG anneal has a bluish color, arising from the thick surface oxidation. The blasting is continued until the bluish color turns gray, indicative of silicon with perhaps a very thin native oxide. Preferably, the silicon carbide particles are relatively pure to above 99%, particularly with respect to metals. Use of particles with significant metal contaminants will likely introduce the metal into the silicon part, rendering the treated part much less useful for processing silicon integrated circuits.

Following bead blasting, the treated silicon surface is cleaned by vigorous washing with a biodegradable, non-phosphate detergent such as Escolex to remove silicon particles clinging to the surface. A final clean with a high-pressure carbon dioxide gun, such as Sno Blo, removes any remaining particles. The final surface roughness has been measured to be typically about 32 microinches (0.8 μm) on the virgin poly legs and 50 microinches (1.3 μm) on the CZ bases. A preferred range of surface roughness, particularly for the legs, is 10 to 100 microinches Ra (0.25 to 2.5 μm Ra). A more preferred range is 20–75 microinches Ra (0.5–1.9 μm Ra), and a most preferred range is 30–50 microinches Ra (0.75–1.25 μm Ra).

It is preferred that no post-treatment etching be performed as this would likely remove the pits and cracks. Post-treatment polishing is also not preferred, except possibly in the wafer bearing surfaces which, in a preferred embodiment, are cut into teeth slanting upwards from the legs at 1 to 3° from the horizontal.

Other hard particles may be used for the blasting, such as ceramics. However, the material must be substantially free of metals known to readily diffuse in silicon and affect its semiconductor qualities. Other types of surface treatment are possible, such as lapping and grinding. However, these processes are dirty, and offer no apparent advantage.

Figure 6:
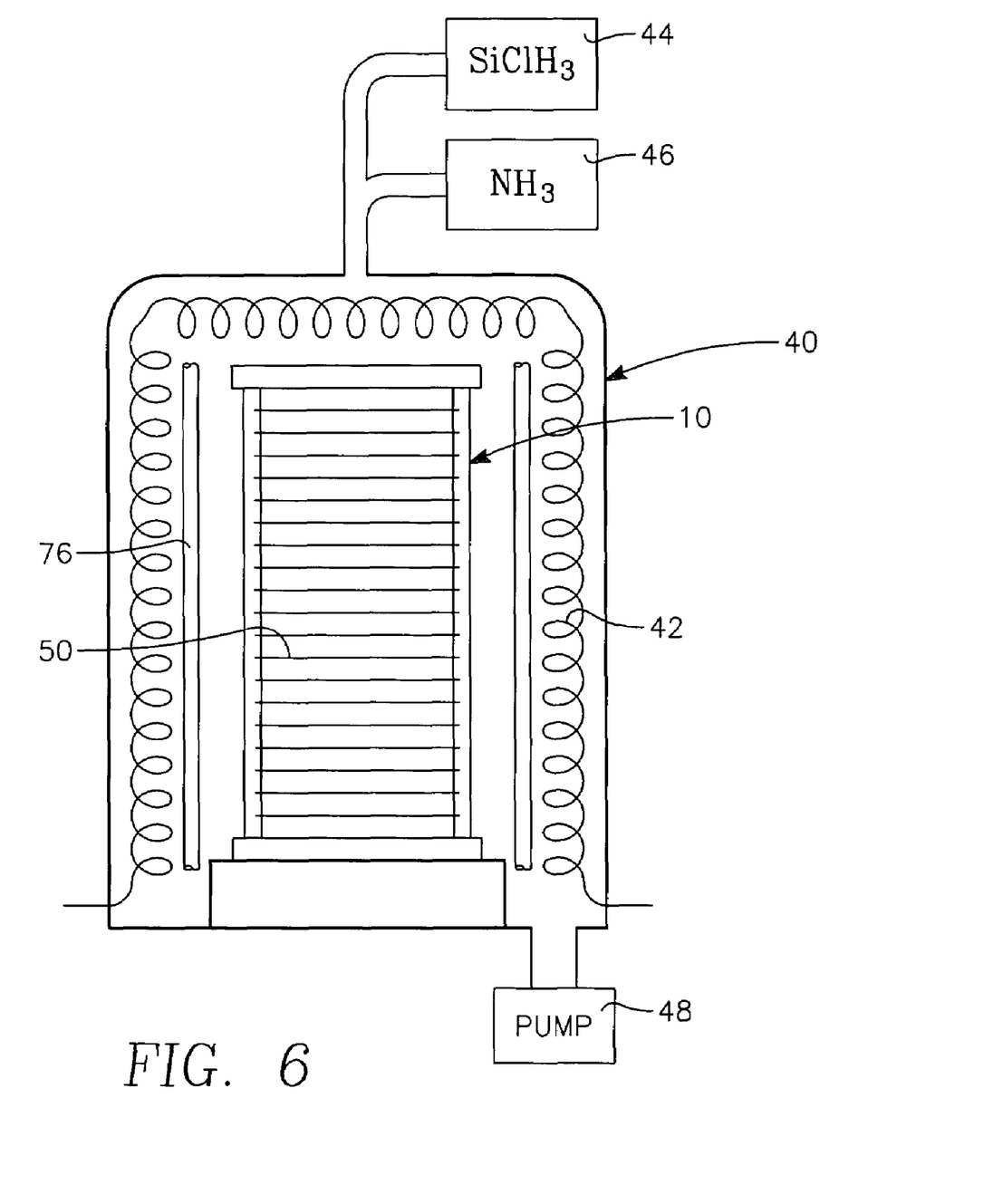
FIG. 6 is a schematic cross-sectional view of a thermal CVD reactor in which a process of the invention may be practiced and in which the tower or shield of the invention may be used.

The silicon tower 10 fabricated according to the above process is used in a batch CVD reactor 40, as illustrated in FIG. 6, which is heated by a resistive coil 42. The reactor is supplied with precursor gases including silane or a chlorosilane such as $SiClH_3$ and ammonia ($NH_3$) from source 44, 46, and a vacuum (exhaust) pump 48 evacuates reactants from the interior of the reactor 40. The pump 48 may maintain the interior of the reactor 40 at anywhere in the range from approximately atmospheric pressure for atmospheric pressure CVD (APCDV) down to about 10 Torr for low pressure CVD (LPCVD). Multiple wafers 50 are loaded into the tower 10 and processed as described above to deposit the silicon nitride in one batch run. When a boat instead of a tower is used, the thermal CVD reactor is typically in the form of a horizontally extending tube, into which the boat bearing multiple wafers is horizontally inserted. The same production reactor may be used to pre-coat the silicon nitride layer onto the tower while no wafers are supported in production slots.

Nitride pre-coats are believed to provide increased surface integrity of the silicon parts in a hot or harsh environment because of the known toughness of silicon nitride.

Such surface-treated silicon towers can be used for hundreds to thousands of runs. The nitride build up seems to be limited only by the accumulating nitride filling the slots between the teeth and impeding mechanical clearance of the wafers. Such thicknesses of silicon nitride can be removed by reslotting the teeth or by a long etch in hot hydrofluoric acid.

Polysilicon is also frequently deposited by thermal CVD typically using a silane or chlorosilane precursor gas. A silicon tower for polysilicon CVD deposition is advantageous since the CVD polysilicon is well matched to the virgin poly and possibly other forms of silicon in the tower. A smooth silicon tower surface may suffice for polysilicon deposition. However, it has been observed that CVD polysilicon flakes from IC wafers. Accordingly, if the same mechanism applies to silicon towers, the surface treatment of the invention is useful in providing additional bonding between the bulk silicon parts and the deposited polysilicon layers.

The silicon tower subjected to the nitride pre-coating described above can be used in a very high temperature anneal step, such as a reflow of a silicate glass. Thick layers of silicate glasses may be formed by flame hydrolysis deposition (FHD) in which silane is supplied to a hydrogen and oxygen torch and the flame is passed over the substrate, typically a silicon wafer, to deposit a silicate glass having a nominal composition of $SiO_2$. Germane or other germanium precursors may be additionally included in the flame feed, as well as is water vapor, to affect the refractive index and dielectric constant of the deposited glass. However, the so deposited material is typically not homogeneous and requires for a commercially popular formulation of the silicate glass a high-temperature reflow at 1350° C.±30° C., preferably 1360° C.±10° C. typically in an air ambient, to convert the material to a homogeneous glass. Some other types of glasses reflow at as low as 600° C., but the problems described below tend to become problems only at reflow annealing temperatures of greater than 1200° C. A silicon tower is sufficient for supporting substrates in such a high-temperature process since it remains relatively strong close to its melting point of 1416° C.

Figure 7:
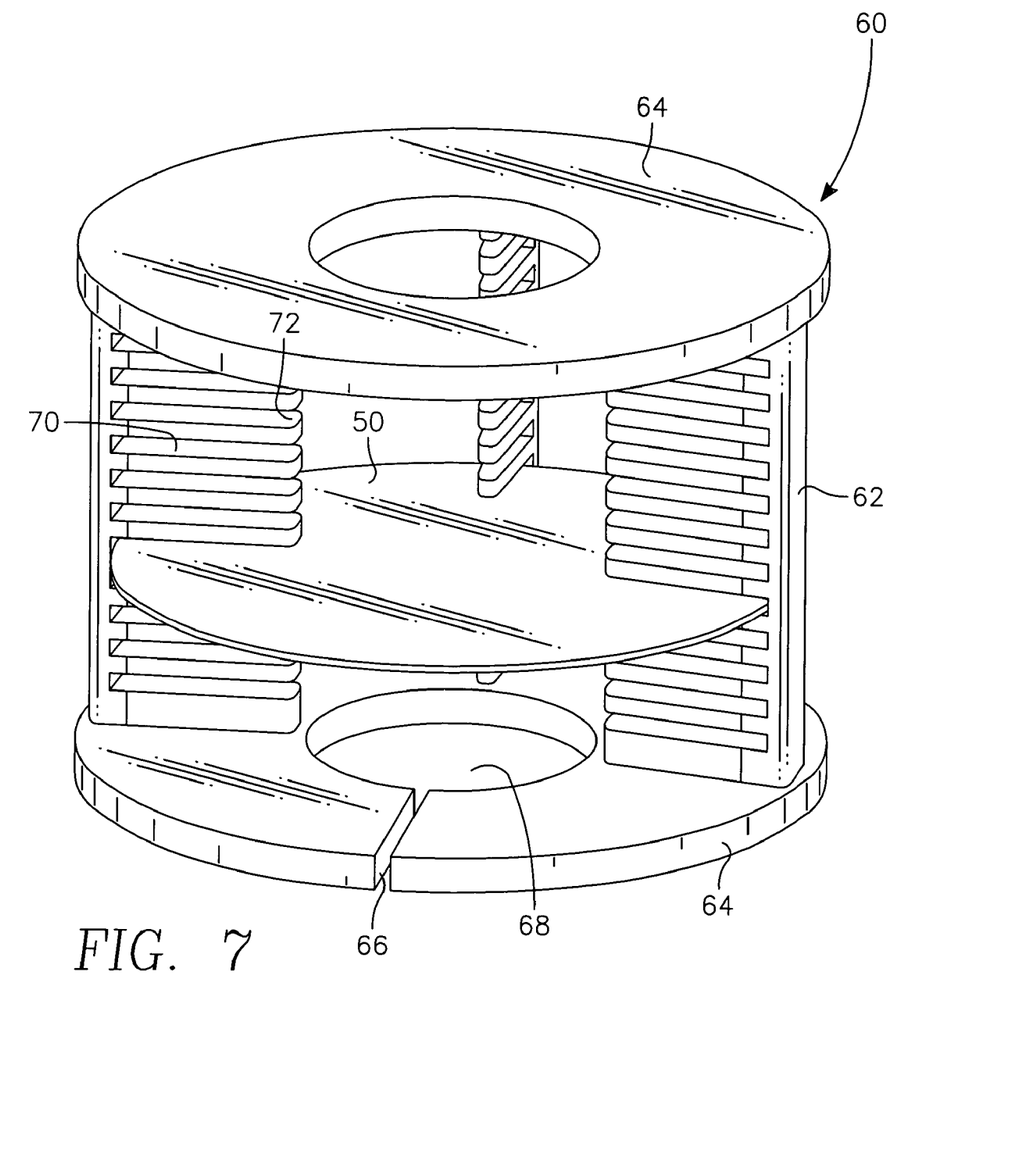
FIG. 7 is an orthographic view of another silicon tower usable with a high-temperature reflow process.

One such silicon tower 60, illustrated in the orthographic view of FIG. 7, was designed for such a high-temperature process. The tower 60 has three silicon legs 62, preferably of virgin polysilicon, joined to two silicon bases 64 with a radial expansion slot 66 formed in the lower one between its outer periphery and an inner aperture 68. Each leg 62 includes multiple teeth 70 upwardly inclined at angles of between 86° and 89° with respect to the longitudinal axis of the leg 62 with a support surface 72 formed substantially perpendicularly to the longitudinal axis for supporting one of multiple wafers 50. The support surfaces 72 may be polished to a mirror smoothness. In order to minimize wafer droop at the very high processing temperatures, it is preferred that the legs 62 be located at about 120° angular spacings with long teeth 70 having their support surfaces 72 located at about 0.707 of the wafer radius although a position at between 69% and 72% of the wafer radius would provide nearly equal results. Droop can be further reduced by the use of four legs with their support surfaces arranged in a square pattern at 0.707 of the wafer radius.

However, at the temperatures required for reflow, the silicate glass tends to drip over the edge of the wafer and to contact the support tower around the edges of the wafer. If the contacted material is silicon, the very hot silicate glass is likely to chemically bond to the silicon. After completion of the reflow when the temperature is reduced, the wafer is believed to be bonded through the reflowed glass to the tower. Excessive force in breaking the bond may chip the silicon of the tower or fracture the wafer, either creating major contamination problems.

The chipping and fracturing can be greatly reduced if the assembled silicon tower before use is pre-coated with of a layer of silicon nitride to a thickness in the range of 0.1 to 10 μm, 0.3 μm being a typical minimum thickness. The deposition onto all areas of the tower used to support production wafer may be performed by chemical vapor deposition, as described above. Nitride tends not to wet other materials such as silica and silicate glasses and the nitride does not react with silica so that the reflowed glass contacting the nitride pre-coat is easily released and removed from the processing chamber with the wafer. Wafers annealed on such a nitride pre-coated tower have been observed to less readily stick to the tower and to not be chipped. Although it is recommended that the silicon tower be surface treated prior to the nitride pre-coating, in this application, nitride flaking is much less of a problem so that the surface roughening provided by surface treatment may not be needed. However, the surface roughness produced by the surface treatment increases the adhesion of the nitride pre-coat layer to the silicon tower and thus further prevents peeling of nitride when the reflowed glass is forcefully removed. Thereby, the integrity of the nitride pre-coat layer is preserved over a long commercial use.

The same preventive mechanism is useful when the wafer is being flame hydrolyzed while supported on a silicon pedestal fixture pre-coated with a nitride layer.

Although the invention is particularly useful for support towers and boats supporting multiple wafers, it may also be applied to other parts that are exposed to deposition. For example, a tubular sleeve 76 may be inserted in the CVD reactor 40 of FIG. 6 to control the flow of gases in the reactor. Whatever deposition occurs also coats the interior of the sleeve 76, which may be removed and replaced. In the past, the sleeve 76 has been composed of quartz. A quartz sleeve suffers many of the same problems as a quartz tower. Instead, according to the invention, the sleeve 76 is composed of silicon having a tubularly shaped wall of about 2 to 5 mm thickness. At least its interior walls are surface treated by bead blasting or the like to provide a good anchor for the deposition of many layers of silicon nitride. The lifetime of the treated silicon sleeve 76 is substantially longer than that of a quartz sleeve.

Figure 8:
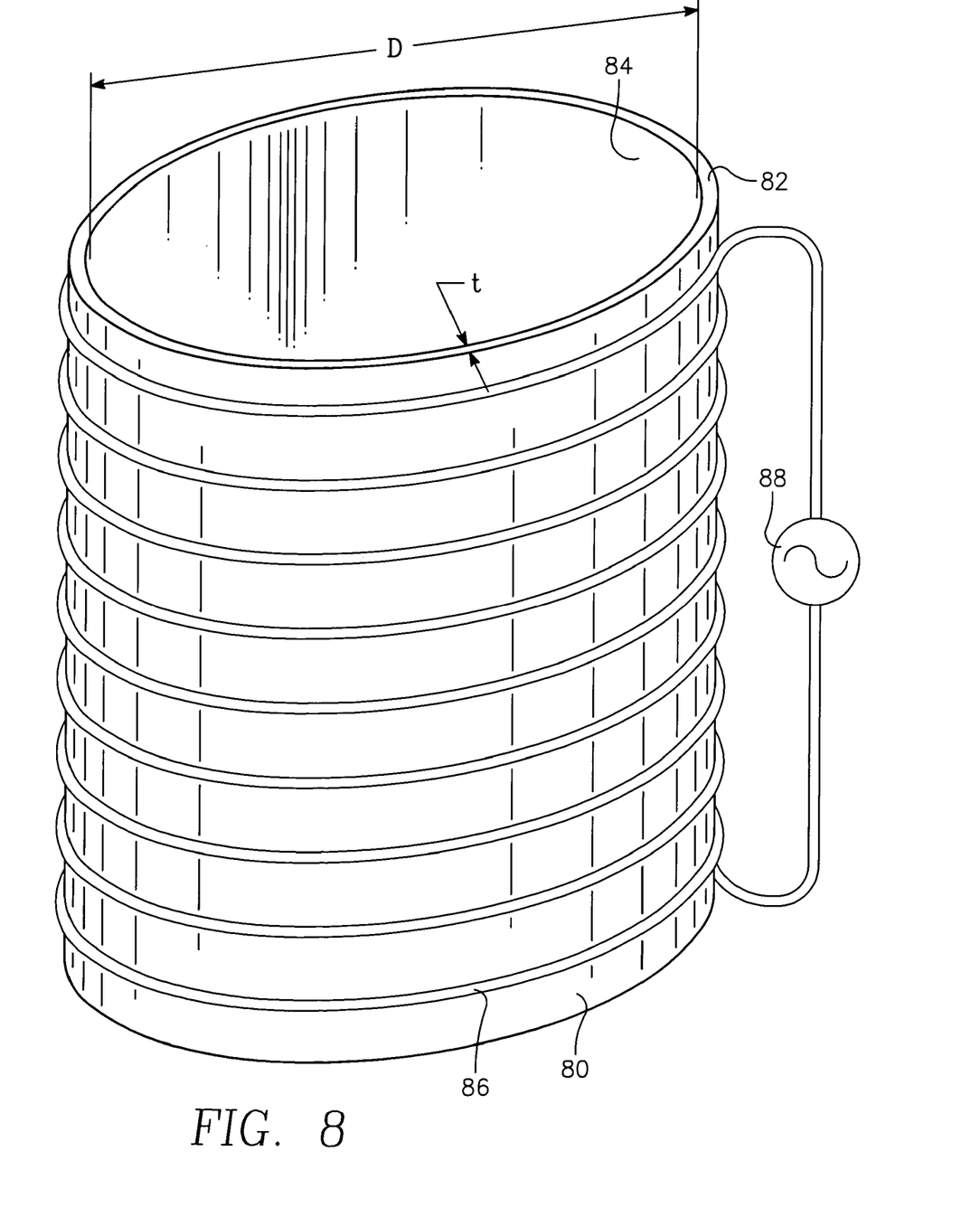
FIG. 8 is a schematic orthographic view of a tubular reactor having silicon sidewalls.

A silicon chamber part shaped similarly to the silicon sleeve 76 is a silicon reactor tube 80 illustrated in the schematic orthographic view of FIG. 8. It has a circularly symmetric wall 82 of thickness t enclosing a bore 84 of diameter D. A resistive heater 86 is wrapped around the tube 80 and is powered by a power supply 88 to heat the interior of the reactor to elevated temperatures. Other forms of heating are possible, such as radiant or RF inductive heating. If the silicon tube 80 has sufficiently high doping so as to be highly conductive, the RF energy may be coupled directly into the tube 80, in which case the power supply 88 supplies RF power rather than AC or DC and the wire 86 may be offset from the tube wall 82.

The diameter D is large enough to accommodate a wafer tower or wafer boat supporting 30 a number of wafers. That is, the diameter D is somewhat larger than the wafer diameter of, for example, 200 or 300 mm. For a tower, the tube is arranged vertically; for a boat, the tube is arranged horizontally and preferably the boat is support on rails cantilevered parallel to the tube wall 82. In either case, the support fixture loaded with wafers is placed in the reactor tube. In a vertically arranged reactor, either the tube is lowered over a stationary tower or the tower may be inserted vertically into a stationary tube. On the other hand, a wafer boat is moved horizontally into a stationary horizontally arranged reactor tube.

The silicon tube 80 is held between unillustrated end caps, preferably formed of surface-treated silicon, providing a support for the tower or boat and ports for the supply gases and exhaust or vacuum pump of FIG. 6. If necessary, the end caps are vacuum sealed to the tube 80 for the relatively modest vacuums required. The thickness of the tube wall 82 is preferably at least 3 mm and more preferably at least 5 mm. Such a reactor tube thereby allows a large portion of the exposed surfaces of the reactor to be composed of high-purity silicon. Such reactor tubes, previously made of quartz or sometimes silicon carbide, are used for thermal CVD of silicon nitride and polysilicon, as previously described, for wet or dry thermal oxidation of silicon, for diffusion doping from an ambient including the doping material, inert annealing including a dopant drive-in, and for other high temperature processes. Advantageously, especially for thermal CVD, the interior surface of the tube wall 84 is surface treated to provide additional adhesion to the deposition material.

Other parts in this or other deposition chambers, such as pedestals, pedestal rings, and rails, typically formed of quartz in the past, may instead be formed of silicon, preferably virgin poly if it is available in adequate sizes, and thereafter surface treated as described above.

Although virgin poly is particularly advantageous for silicon parts which contact the wafer, other chamber parts such as the above described sleeve and wall do not require the very high purity levels associated with virgin poly. The surface treatment described above may be applied to other forms of silicon, for example, float zone (FZ) silicon, CZ silicon, cast silicon, edge film grown (EFG) silicon, the last two forms of which are prevalently used for solar cells, or other types such as extruded silicon. It is also possible to perform the described surface treatment on a silicon film deposited on another base material, for example, by CVD.

At the present time, virgin polysilicon is not available in diameters greater than 200 mm required for the sleeve and reactor tube described above. Silicon of lesser purity is acceptable in many processing applications in which a high-temperature silicon part does not touch the silicon wafer. Nonetheless, the silicon parts should be made of silicon that is substantially pure, for example, has a impurity atomic fraction of metals of less than one part per million and of other components including oxygen, nitrogen, and carbon of substantially less than 1% and preferably less than 50 parts per million. Alternatively, the silicon may be characterized as being semiconductive.

One method of forming the tubular silicon sleeve and wall described above is extrusion of silicon in a circularly symmetric tubular shape in a process also called edge film growth (EFG). Some older technology for doctor-blade extrusion of silicon is disclosed by Grabmaier et al. in U.S. Pat. Nos. 4,330,358 and 4,357,201. This technology sinters the extruded form and uses germanium sintering aids, including semiconductor dopants if desired. More recent technology including extruding silicon tubes is disclosed by Stormont et al. in U.S. Pat. No. 4,440,728 and by Harvey et al. in U.S. Pat. No. 5,102,494. GT Equipment Technologies, Inc. of Nashua, N.H. has commercialized and markets technology for extruding large hollow silicon members in polygonal shapes, and sells an extruder under the trade name GIi EFG Puller. It has long been known to form small-diameter sapphire circular and polygonal tubes by EFG.

Silicon chamber walls may alternatively be formed by bonding together a relatively small number of silicon plates in a closed pattern as one would assemble staves into a barrel. However, this technique is not always successful because the polygonal shape may introduce non-uniform flow patterns. Further, the bonding agent used to fix the plates together may be a contaminant for semiconductor processing.

Figures 9, 10:
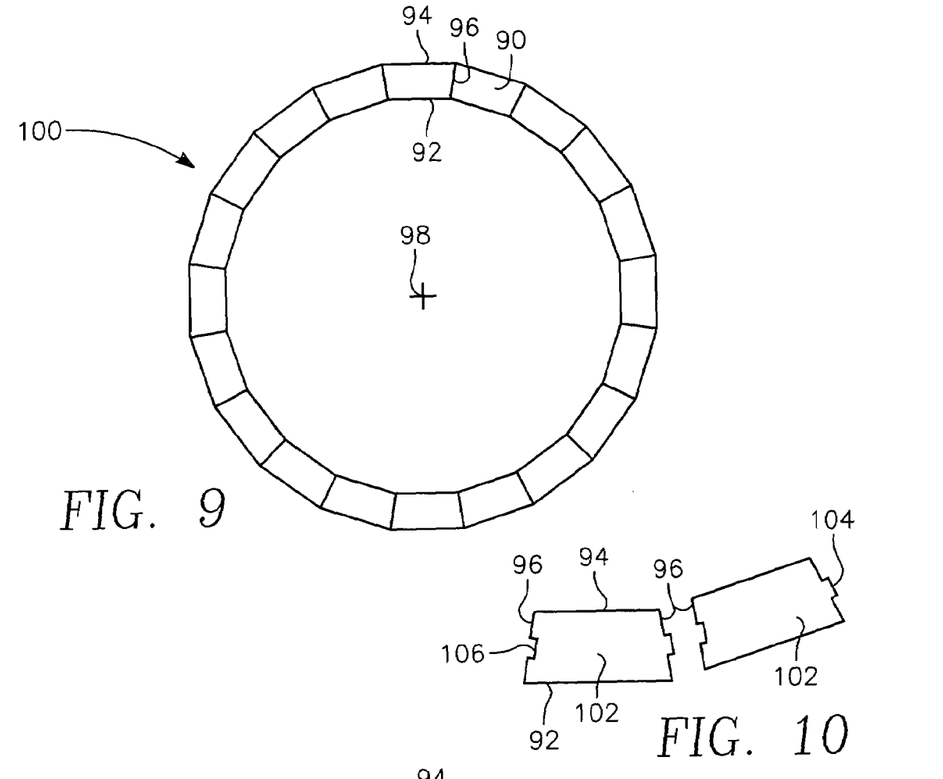
FIGS. 9 is a cross-sectional view illustrating the fabrication of a silicon tube by fixing together a plurality of horizontally extending silicon staves.
FIG. 10 is a cross-sectional view of staves having a tongue-and-groove structure.

An improvement of the stave approach is illustrated in the cross-sectional view of FIG. 9. A large number of staves 90 are machined to have a cross-sectional shape of symmetric trapezoids with two parallel faces 92, 94 and two faces 96 inclined with respect to each other at angles so that the faces 96 of neighboring staves 90 are parallel. The shape uniformly extends along an axial direction. The staves 90 are composed of silicon, preferably virgin polysilicon The machining of virgin polysilicon is described in the afore cited U.S. patent application Ser. No. 09/608,557. The staves 90 number at least twelve and preferably twenty or more. Other shapes are possible, but the symmetric trapezoid is preferred to ease machining and assembly.

The staves 90 are assembled in a closed pattern with their longitudinal axes oriented parallel to a central axis 98 with the inclined sides 96 of neighboring staves 90 abutting each other to form a tightly fitting polygonal tube 100 formed in a generally circular pattern about the central axis 98. The large number of staves reduces the interior asymmetry of the assembled tube and simplifies any circularizing. The staves 90 can be held together prior to being bonded together by sleeves or hoops of quartz or other material placed around their ends. The staves 90 are then fixed together to form a wall. For a tubular silicon liner used within another tube, the silicon tube need not be vacuum tight. However, for a silicon vacuum wall, the joints must be made vacuum tight.

The fixing process may include applying a thinned spin-on silica glass (SOG) to the inclined faces 96 before assembling the staves 90 and thereafter curing the spin-on glass, as described in previously cited U.S. patent application Ser. No. 09/608,557. While this method is effective for tubes used at lower processing temperatures, the method suffers at very high processing temperatures because the silica glass softens at elevated temperatures. Instead, it is preferred to use a silicon welding technique described by Zehavi et al. in U.S. Pat. No. 6,284,997. For a non-vacuum wall, the staves 90 may be spot welded at their ends or at occasional spots along their length, and the clean silicon weld described in U.S. Pat. No. 6,284,997 is not required. For a vacuum wall, however, a full welding bead needs to extend along at least one side of the interface between the inclined faces 96 of the staves 90, and the weld must be smooth and clean.

The joining of the staves 90 is simplified if staves 102, illustrated in cross-sectional view of FIG. 10 are machined into generally trapezoidal form but with respective axially extending tongues 104 and grooves 106 are formed in the opposing inclined faces 96. The staves 102 are then assembled by fitting the tongue of one stave 102 into the groove 106 of the neighboring stave 102 with the neighboring inclined faces 106 in abutment. If multiple tongues and grooves are used, the resulting structure has a corrugated joint.

In some applications, it may be desired to form the tube to have a circularized inner surface. In this embodiment, as illustrated in the cross-sectional view of FIG. 11, the joined polygonal tube 100 is machined on its inside, for example on a lathe or reamer, to form a cylindrical inner surface 108 symmetric about the central axis 98. The resulting tube 110 has a circular inner wall 100 and a polygonal outer wall. The interior circular shape greatly simplifies gas flow dynamics during processing of wafers. The outer wall may also be circularized, but this further step is not always necessary.

Figure 11:
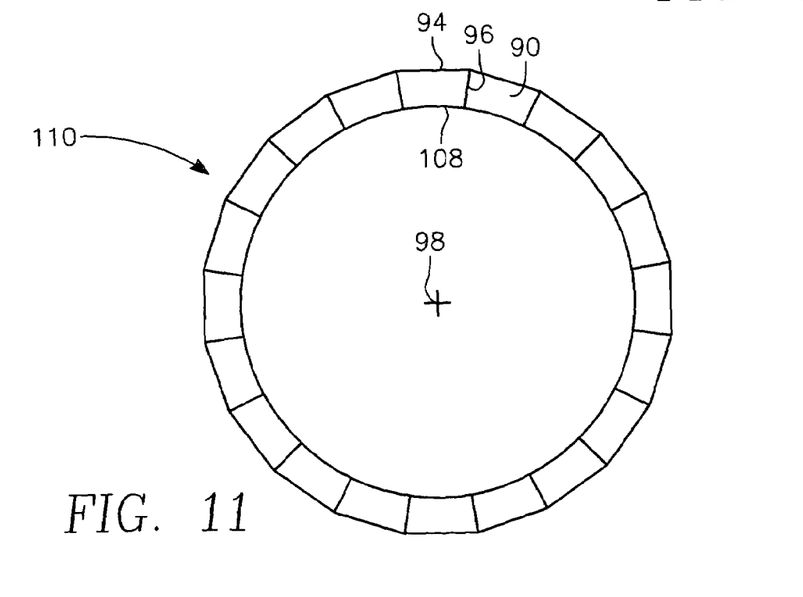
FIG. 11 is a cross-sectional view of a circularized silicon tube.

The tube 100 or 102 may then be stress annealed or have its inner surface bead blasted or otherwise processed to introduce sub-surface damage. Pre-coats of the sort previously described may also be applied.

The silicon parts of the invention are not limited to batch mode thermal CVD reactors. They can be used for plasma CVD and other low temperature processes performed with wafer temperatures below 400° C. For example, a single-wafer plasma CVD reactor has a side wall and a dome onto which the intended deposition material is likely to also be deposited. In the past, the wall and dome have been typically made of quartz, and a plasma cleaning process has been used to clean the wall and dome surfaces, either between every wafer run or on a less frequent schedule. If the quartz wall, dome, or other part is replaced with a corresponding silicon part surface treated as described above, the plasma cleaning may be eliminated or perhaps delayed until a planned maintenance shutdown. Plasma etching reactors are also subject to deposition of polymeric material and other residues on the chamber walls and parts. The roughened silicon described above will more firmly anchor the residues and reduce the production of particulates.

The invention thus provides a generic approach for reducing particles in substrate processing reactors by the use of surface worked silicon parts. Nonetheless, the silicon material of the parts is readily available at reasonable costs and does not require complex processing.

The invention claimed is:

1. A method of forming a silicon tube, having a longitudinal axis comprising: bonding together a plurality of at least twelve silicon staves consisting of silicon and less than 1% atomic fraction of elements other than silicon, arranged in a circular pattern that is closed about the longitudinal axis and a central axis, and all extending in a direction parallel to said central axis.

2. The method of claim 1, wherein said bonding process includes welding together neighboring ones of the staves.

3. The method of claim 1, wherein said bonding process includes applying a bonding agent to interfaces between said staves.

4. The method of claim 3, wherein said bonding agent comprises a silica-based spin-on glass.

5. The method of claim 1, wherein said staves have grooves and tongues fittable in said grooves and extending parallel to said central axis.

6. The method of claim 1, wherein staves comprise virgin polysilicon.

7. The method of claim 1, wherein said staves have trapezoidal shapes.

8. The method of claim 1, further comprising circularizing interior surfaces of said staves fixed together.

9. A method of forming a closed tabular wall, having a longitudinal axis comprising bonding together a plurality of silicon plates consisting of silicon and less than 1% atomic fraction of components other than silicon and arranged in a generally polygonal pattern that is closed about the longitudinal axis.

10. The method of claim 9, wherein said bonding includes applying a spin-on silica glass to interfaces between said plates.

11. The method of claim 9, wherein said bonding includes welding said plates together.

12. The method of claim 9, wherein said plates comprises virgin polysilicon.

13. A fabrication and use method comprising the steps of: extruding from a silicon melt a circular silicon tube having a longitudinal axis, wherein the silicon tube is closed about the longitudinal axis, consists of silicon and less than 1% atomic of components other than silicon, and has a bore between walls of the silicon tube; and placing within the bore a support tower supporting a plurality of wafers having a diameter.

14. The method of claim 13, wherein said extruding comprises edge film growth.

15. The method of claim 13, wherein said diameter is at least 200 mm.

16. The method of claim 1, wherein said at least twelve silicon staves comprise of east twenty of said silicon staves.

17. The method of claim 1, wherein said silicon staves fixed together form a closed tubular member of said silicon starves.

18. The method of claim 1, wherein said tube formed by said staves has an internal diameter of greater than 200 mm.

19. A method of forming a silicon tube, comprising the steps of:

arranging a plurality of silicon staves consisting of silicon and less than 1% atomic fraction of components other than silicon and extending along an axis in a closed pattern in which any of said staves forms two interfaces with two neighboring ones of said staves, whereby a closed polygonal tubular member is formed having an aperture extending along said axis; and bonding together all neighboring ones of said staves.

20. The method of claim 19, wherein the silicon staves comprise silicon members consisting essentially of silicon.

21. The method of claim 1, wherein the staves comprise silicon bulk members consisting essentially of silicon.

22. The method of claim 1, wherein the staves consist essentially of silicon.

23. The method of claim 9, wherein the silicon plates comprise silicon members consisting essentially of silicon.

24. The method of claim 13, wherein said silicon tube consists essentially of silicon.

25. The method of claim 13, wherein the tube within which is placed the tower is a sleeve disposed within a chamber including a resistive heater and the tower comprises a silicon tower and the wafers comprise silicon wafers.

26. The method of claim 1, further comprising:

disposing the tube within a chamber including a resistive heater; and placing within the tube a support tower supporting a plurality of wafers.

* * * * *